United States Patent
Viswanath

[11] Patent Number: 5,944,093
[45] Date of Patent: Aug. 31, 1999

[54] PICKUP CHUCK WITH AN INTEGRAL HEAT PIPE

[75] Inventor: Ram S. Viswanath, Phoenix, Ariz.

[73] Assignee: Intel Corporation, Santa Clara, Calif.

[21] Appl. No.: 09/000,719

[22] Filed: Dec. 30, 1997

[51] Int. Cl.[6] ................................... F28D 15/00
[52] U.S. Cl. ..................... 165/104.26; 165/46; 165/80.3; 361/700; 257/719; 324/760; 174/15.2
[58] Field of Search ................................ 165/46, 104.26, 165/80.3; 257/715, 718, 719; 361/697, 700; 174/15.2; 324/754, 761, 252, 760

[56] References Cited

U.S. PATENT DOCUMENTS

| | | | |
|---|---|---|---|
| 3,604,504 | 9/1971 | Kessler, Jr. et al. | 165/46 |
| 4,951,740 | 8/1990 | Peterson et al. | 165/104.33 X |
| 4,997,032 | 3/1991 | Danielson et al. | 165/46 |
| 5,083,605 | 1/1992 | Collings | 165/104.33 X |
| 5,097,385 | 3/1992 | Chu et al. | 165/104.33 X |
| 5,168,921 | 12/1992 | Meyer, IV | 165/46 X |
| 5,343,940 | 9/1994 | Jean | 165/46 X |
| 5,552,960 | 9/1996 | Nelson et al. | 165/104.33 X |
| 5,582,242 | 12/1996 | Hamburgen et al. | 165/104.33 X |
| 5,640,303 | 6/1997 | Hooley | 165/46 X |

FOREIGN PATENT DOCUMENTS

| | | | |
|---|---|---|---|
| 0083183 | 5/1983 | Japan | 165/104.33 |
| 0083184 | 5/1983 | Japan | 165/104.33 |
| 0119659 | 7/1983 | Japan | 165/104.33 |
| 0126098 | 5/1990 | Japan | 165/46 |
| 1402789 | 6/1988 | U.S.S.R. | 165/46 |

*Primary Examiner*—Christopher Atkinson
*Attorney, Agent, or Firm*—Blakely, Sokoloff, Taylor & Zafman

[57] ABSTRACT

An apparatus and method for controlling the temperature of a heat generating device. In one embodiment, a pickup chuck having a heat pipe is provided. The heat pipe includes a first end defining an evaporator portion and a second end defining a condenser portion. A thermally conductive member at the first end of the heat pipe is adapted to engage a surface of the heat generating device. Heat is transferred away from the heat generating device by engaging the thermally conductive member with a surface of the heat generating device.

12 Claims, 5 Drawing Sheets

PICKUP CHUCK WITH AN INTEGRAL HEAT PIPE

FIELD OF THE INVENTION

The present invention relates to a method and apparatus for removing heat from the surface of a heat generating device, and, more particularly, to removing heat from the surface of an integrated circuit die or package during the functionality and/or performance testing of the device.

BACKGROUND OF THE INVENTION

Integrated circuits are typically housed within a package that is mounted to a printed circuit board (PCB). The package is designed to protect the integrated circuit device from damage, to provide adequate heat dissipation during operation, and to provide electrical connection between the integrated circuit device and a PCB (e.g., a peripheral card, a motherboard and the like). These conventional packages may include a variety of packages such as pin grid array (PGA), land grid array (LGA), ball grid array (BGA), column grid array (CGA), and other packages. As a part of the manufacturing process, integrated circuits typically undergo a variety of functional test. The present invention is aimed at removing heat from the surface of an integrated circuit that is housed within a package during the functional testing of the integrated circuit device. The functional test is performed before a package is mounted to a printed circuit board. The purpose of the test is to check the functionality and to monitor the electrical performance of the integrated circuit. The functional test is generally performed within a temperature controlled chamber. A vacuum pick-up chuck is typically used to position the package within the chamber. The electrical testing of the integrated circuit is performed by positioning the package within the chamber such that the package contact pads/connectors are in electrical contact with a corresponding set of contact pads/connectors located on the contactor/load board of a test apparatus. Information pertaining to the electrical performance of the device is gathered during the test. The information is then used to screen out devices and to classify the integrated circuits according to their operating frequency. This process is commonly referred to as "binning out."

It is commonly known that as the temperature of an integrated circuit rises, the frequency at which the device operates decreases. Therefore, it is important to control the temperature of the integrated circuit during the functional test to ensure that the device is appropriately separated or "binned" according to its operating frequency. It is also important to control the temperature of the integrated circuit since excessive temperatures may affect the performance of the circuit and cause permanent degradation of the device. In addition, it is desirable to hold the temperature of the integrated circuit device at a relatively constant temperature throughout the testing sequence.

The traditional method for cooling integrated devices has been through convection heat transfer. Using this method, heat is dissipated from the integrated circuit through the outer surfaces of the integrated circuit device into still or moving air. As the integration level (i.e., the number of transistors per device) of integrated circuits increases, or the power requirements or the operating speed of integrated circuits increases, the amount of heat generated by these devices increases to a point where conventional convection solutions are inadequate. If the integrated circuit device is not adequately cooled during the test, and is permitted to rise significantly above a designated test temperature, the device may be unnecessarily down-graded into a lower frequency bin.

Thus, what is needed is a method and apparatus for controlling the temperature of an integrated circuit device while the device is being tested.

SUMMARY OF THE INVENTION

The present invention is an apparatus and method for controlling the temperature of a heat generating device. In one embodiment, the invention involves the use of a pickup chuck having a heat pipe attached thereto. The heat pipe includes a first end defining an evaporator portion and a second end defining a condenser portion. A thermally conductive member at the first end of the heat pipe is adapted to engage a surface of the heat generating device. Heat is transferred away from the heat generating device by engaging the thermally conductive member with a surface of the heat generating device.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for cooling a heat generating device is described. In the following description, numerous specific details are set forth such as material types, dimensions, etc., in order to provide a thorough understanding of the present invention. However, it will be obvious to one of skill in the art that the invention may be practiced without these specific details. In other instances, well known elements have not been shown in particular detail in order to avoid unnecessarily obscuring the present invention. It is important to note that this discussion will mainly be limited to those needs associated with controlling the temperature of an integrated circuit device. It will be recognized, however, that such focus is for descriptive purposes only and that the apparatus and methods of the present invention may be applied to other applications.

Figure 1:
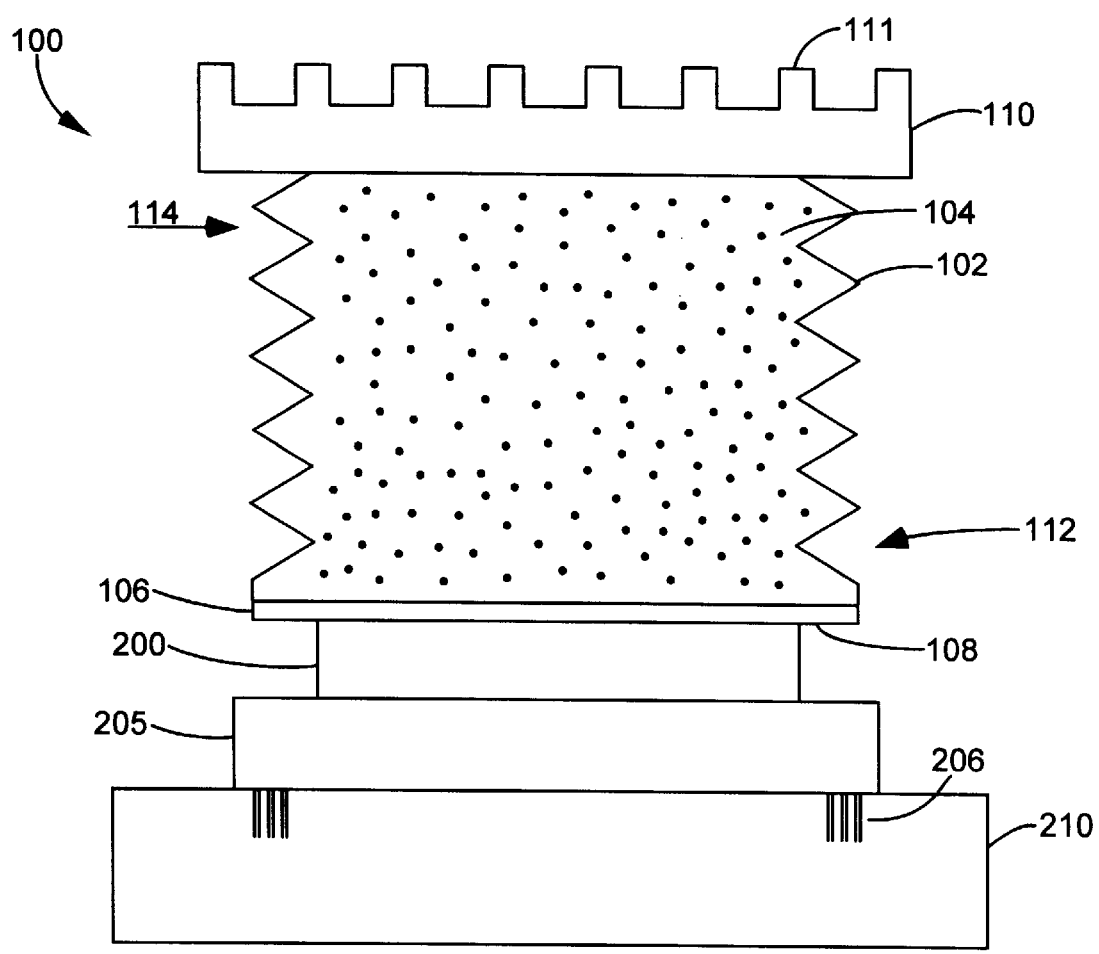
FIG. 1 is a side view of a bellows heat pipe in one embodiment of the present invention wherein the heat pipe is engaged with the backside of an integrated circuit device residing within a PGA package.

As previously discussed, many modern semiconductor devices have evolved to a point where natural convection heat transfer alone is unable to provide adequate cooling to the devices during the performance and functionality test of such devices. In accordance with one aspect of the present invention, a flexible heat pipe is provided for removing heat from the surface of an integrated circuit device. With reference to FIG. 1, a flexible heat pipe 100 in one embodiment of the invention is shown. Heat pipe 100 includes a bellows 102 having a wick structure 104 disposed within a cavity thereof. A thermally conductive member 106 is provided at a first end 112 of bellows 102. A heat sink 110 is provided at an opposing second end 114 of bellows 102. A vaporizable liquid (not shown) resides within the bellows cavity and serves as the working fluid for the heat pipe. In one embodiment, wick structure 104 includes a porous material which is used to facilitate the flow of the working fluid between member 106 and heat sink 110.

The evaporator region of the heat pipe is located adjacent to member 106, whereas the condenser region of the heat pipe is located adjacent heat sink 110. In the evaporator region, the working fluid is vaporized by input heat from the heat generating device, while in the condenser region the vapor gives up heat and is condensed to liquid. The wick 104, by means of capillary flow, transports the condensed liquid back to the evaporator region of the heat pipe.

With continuing reference to FIG. 1, heat pipe 100 is shown contacting the backside of an integrated circuit (die) 200 that is housed within a PGA package 205. Testing of the integrated circuit 200 is achieved by placing the PGA pins 206 within a corresponding set of socket connectors 212 in a contactor 210 that is electrically coupled to a test unit (212). Once an electrical connection between contactor 210 and package 205 is achieved, integrated circuit 200 may be tested in accordance with any number of testing methods and sequences. In any event, testing typically involves the coupling of circuit 200 to a voltage source and some mode of circuit operation. This, in turn, results in the generation of heat which must be dissipated from the integrated circuit device in order to conform to applicable test requirements and/or to maintain the temperature of the device within safe operating limits.

As illustrated, heat is transferred from device 200 by engaging the surface 108 of member 106 with the backside of device 200. Contact between member 106 and device 200 is maintained during the testing of the integrated circuit. In some instances, member 106 may engage the surface of a heat spreader (not shown) that is attached to the backside of the integrated circuit device 200. The compliant nature of heat pipe 100 provides the cooling apparatus with a self-planarizing feature. This feature enhances the heat transfer capability of the apparatus by maximizing the contact surface area between member 106 and integrated circuit 200.

Since the thermal resistance across heat pipe 100 is extremely low, the ability to transport the heat dissipated from device 200 to the much larger surface area of heat sink 110 occurs with a negligible temperature drop. As a result of the heat pipe's superior heat transfer capability, a substantially uniform and lower heat flux can then be realized at the heat sink 110. The lower heat flux makes it much easier to manage the transfer of heat away from the integrated circuit device. Heat is removed from the heat sink by natural convection (still air) or by forced convection (passing an air flow over the heat sink).

In one embodiment, heat pipe 100 and contacter 210 is fully contained within a temperature controlled environmental chamber. By containing the integrated circuit device 200 and heat pipe 100 completely within a constant temperature environmental chamber it is ensured that the temperature of device 200 is maintained above a certain minimum test temperature.

In one embodiment, bellows 102 comprises a stainless steel bellows having a wall thickness of 0.0025 inches. Other materials, such as copper, may also be used in the construction of bellows 102. In such an embodiment, purified water is generally chosen as the heat pipe working fluid since it is chemically compatible with copper and possesses a high latent heat. Wick 104 is typically produced using powder metallurgical processes. The working fluid in the heat pipe is chemically inert with the heat pipe materials and may include coolants such as water, Freon, or other Fluorinerts. The bellows 102 has a length of approximately 0.5 inches with approximately 18 fins/convolutions along its length. The inner cavity diameter and outer fin diameter of the bellows is 0.8 and 1.0 inches, respectively. It is appreciated by those skilled in the art that any change in the material, dimensions, fin pitch, etc., of the bellows will affect the spring rate of the bellows. Therefore, one or all of these characteristics may be altered in order to achieve a desired result. The spring rate of the bellows should provide a sufficient force to the PGA package 205 to ensure a low thermal resistance between member 106 and device 200 even when the bellows is in a partially compressed position.

Thermally conductive member 106 comprises a metal having a high thermal conductivity, such as, for example, copper or aluminum. Conductive member 106 has a thickness of approximately 0.030 inches and may contain a nickel plating along its mating surface for wear resistance. Thinner or thicker thermally conductive members may be used. It is preferable, however, to maintain the thickness of member 106 to a minimum. For example, in one embodiment, member 106 comprises a compliant metal foil. The thinness of the foil results in good compliance, and hence, in a lower thermal resistance across member 106. The compliant nature of the foil also acts to maximize the heat transfer contact area between member 106 and the backside of device 200. The heat transfer surface of member 106 may comprise any of a number of shapes, e.g., circular, rectangular, etc., and is preferably sized to match the surface dimensions of integrated circuit device 200. Member 106 may be attached to bellows 102 by a variety of methods including soldering, electron beam welding, or by the use of a highly conductive adhesive. Member 106 may also be integrally formed with bellows 102.

Heat sink 110 is made of a thermally conductive metal such as copper or aluminum. Fins 111 are provided along the upper surface of heat sink 110 in order to maximize the heat transfer surface area of the heat sink. Heat sink 110 may be attached to bellows 102 by a variety of methods including soldering, electron beam welding, or by the use of a highly conductive adhesive.

The internal structure of the heat pipe may vary considerably from one design to another. It is to be understood, however, that the present invention is not limited to any one heat pipe configuration.

In the implementation of the present invention, a multitude of flexible heat pipes may be used in combination to simultaneously remove heat from a plurality of heat generating devices. Such a configuration is particularly useful when testing a multi-chip module.

Figure 2A:
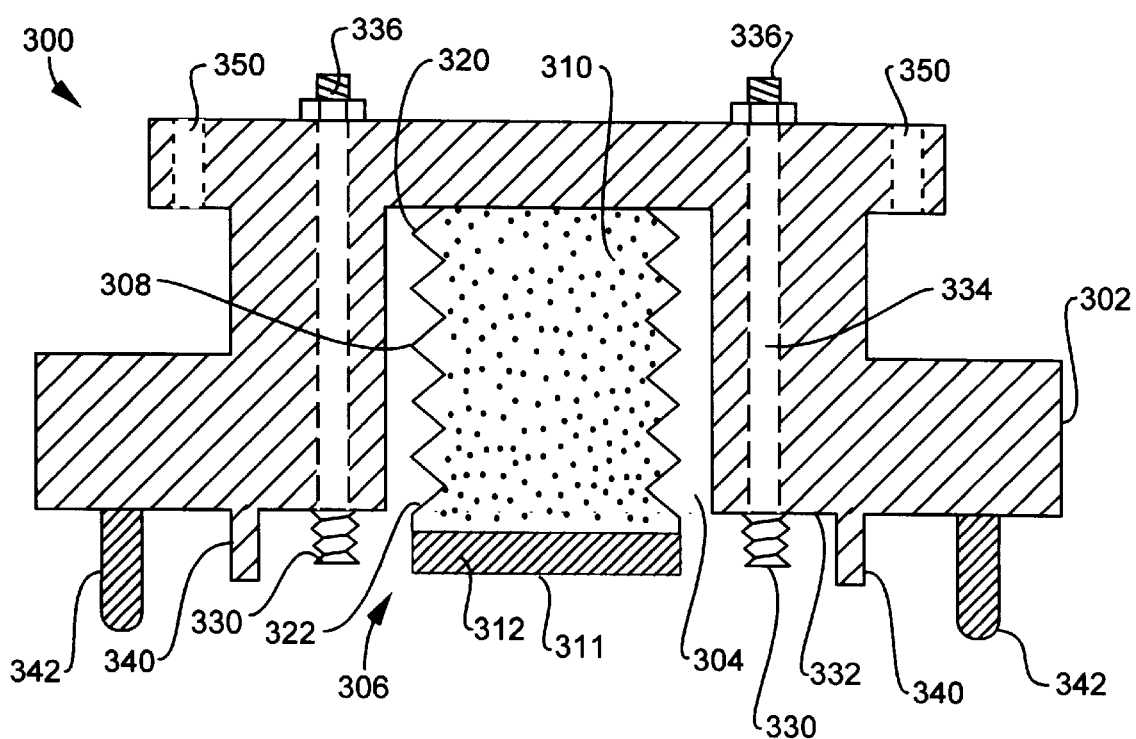
FIG. 2A is a pickup chuck having a flexible heat pipe in one embodiment of the invention.

As discussed above, the testing of an integrated circuit may be performed within an enclosed chamber. The electrical testing of an integrated circuit within the chamber ordinarily involves the use of pick and place units that are used to pick up an integrated circuit at one location and transport the device to a second location. FIG. 2A illustrates a partial side view of a vacuum pick-up chuck assembly 300 in one embodiment of the invention that is attachable to a conventional pick and place unit. Referring to FIG. 2A, vacuum chuck 300 is illustrated having a main body 302. Body 302 includes a cavity 304 for accommodating a flexible heat pipe 306. In one embodiment, a plurality of axially retractable vacuum cups 330 are provided along a planar surface 332 of body 302. Preferably, vacuum cups 330 are formed of a resilient material, and may include a bellows portion which facilitates the retraction of the cups. Vacuum ports 334 are formed within body 302 and are coupled in use to an exterior vacuum source via fittings 336. When the upper flat surface of a PGA package is placed into close proximity with vacuum cups 330, the exterior vacuum source will evacuate air from the package surface and exert a negative pressure upon the package thereby serving to hold the package onto the chuck 300. The negative pressure exerted upon the package is sufficient to collapse vacuum cups 330 drawing the package toward the planar surface 332 of body 302. A nesting area, that is defined by raised lip section 340, is provided to maintain a proper alignment of the integrated circuit package within the chuck. Pins 342 projecting from the surface of the chuck are used for aligning and being inserted within corresponding apertures within a test contactor (not shown).

Figure 2B:
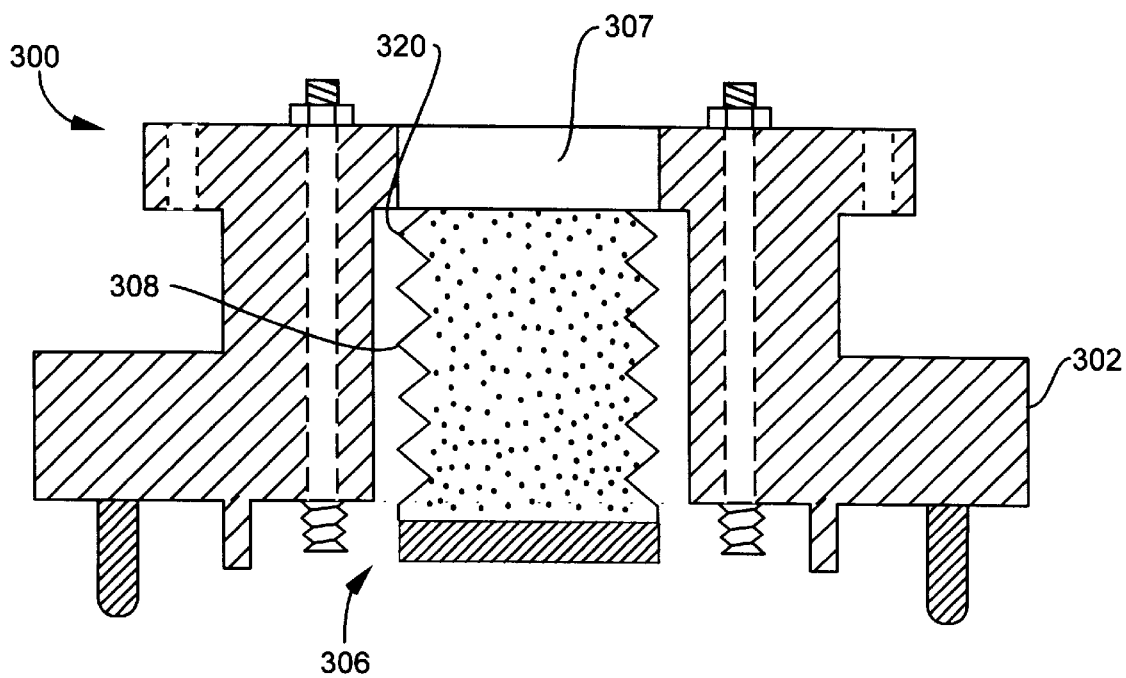
FIG. 2B is a pickup chuck having a flexible heat pipe in another embodiment of the invention.

Heat pipe 306 includes a bellows 308 that is secured to body 302 at a first end 320 by a weld that extends along the periphery of the bellows. In an alternative embodiment, a heat slug 307 or other thermally conductive member is attached to the first end 320 of bellows 308 as shown in FIG. 2B. In such an instance, the heat slug is thermally coupled to the body 302 of pickup chuck 300. In addition, bellows 306 may include flanged sections that could facilitate the clamping or bolting of the bellows to the chuck body. A thermally conductive member 312 having a contact surface 311 for contacting a surface of a heat generating device is provided at a second end 322 of the bellows. A compressible wick structure 310 resides within the bellows cavity. The wick structure 310 facilitates the capillary transport of a working fluid (not shown) between the condenser and evaporator regions of the heat pipe which are located at the first and second ends 320 and 322 of bellows 306, respectively.

Through holes 350 are provided within the chuck body 302 and are used to attach chuck assembly 300 to the attachment arm (not shown) of a pick and place unit. The forces required to compress vacuum cups 330 and bellows 306 is provided by the pick and place unit through the attachment arm(s). Preferably, the pick and place unit is capable of delivering 50 to 60 pounds pressure to the chuck assembly.

Figure 3:
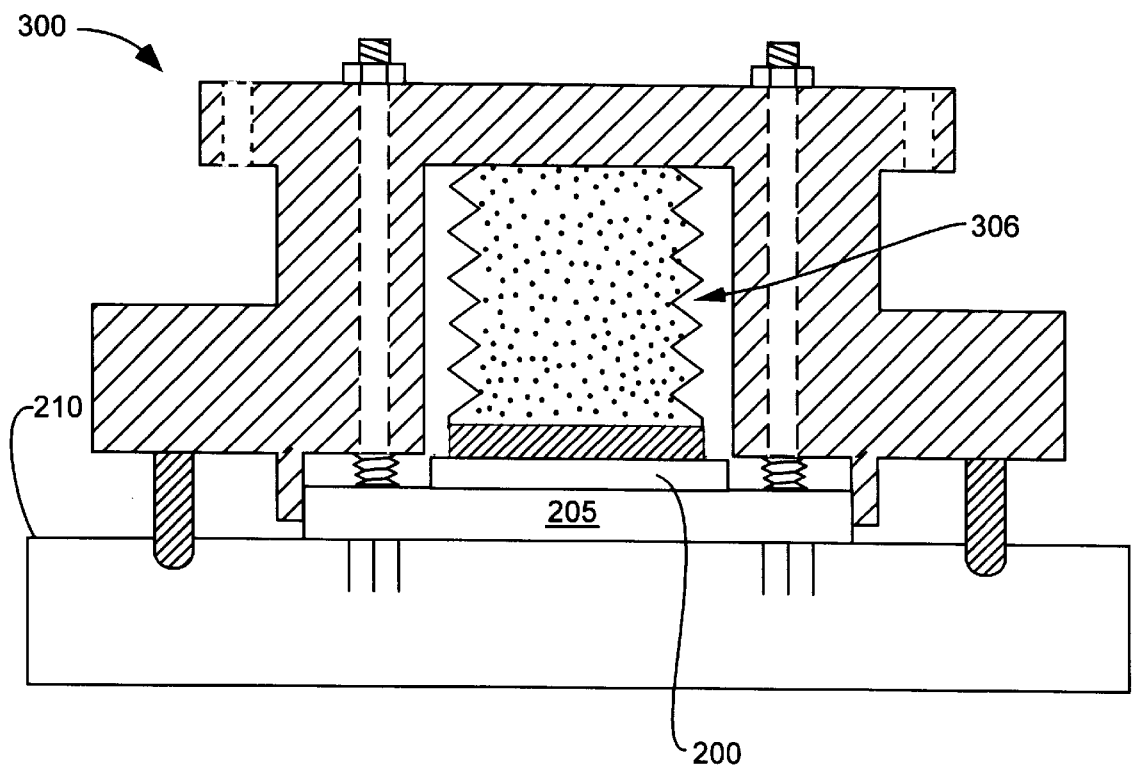
FIG. 3 shows the pickup chuck of FIG. 2A holding a PGA package in contact with a contactor.

FIG. 3 shows pickup chuck 300 holding PGA package 205 within the nest of the chuck and engaging the package with contactor 210. Heat is transferred away from the backside surface of integrated circuit device 200 through member 306. The heat dissipated by device 200 causes a working fluid within the heat pipe to vaporize and migrate to the condenser region of the heat pipe where the vapor gives up heat and is condensed to liquid. The wick 310, by means of capillary flow, transports the condensed liquid back to the evaporator region of the heat pipe. In the embodiment of FIGS. 2A, 2B and 3, the pickup chuck body 302 is made of thermally conductive metal and acts as heat sink by absorbing the heat that is transmitted across heat pipe 306. An air flow directed across the body of the pickup chuck may be provided to enhance the heat transfer capability of the apparatus.

An advantage of the present invention is that the function of the heat pipe is not affected by gravity. As a result, the orientation of the pickup chuck will not adversely affect the heat removal capability of the chuck.

It is known that exposed silicon dice are generally susceptible to cracking at or near the edges of the dice where stress concentration and the possibility of mechanical damage are at their highest. Cracks formed along the edges tend to propagate through the device and may ultimately result in a device failure when subjected to thermal/mechanical stresses. It is therefore desirable to minimize any external contact with the edges of the integrated circuit during manufacturing and testing of the devices. Accordingly, in one embodiment, the contact surface 311 of conductive member 312 is sized to be smaller than the backside surface of integrated circuit device 200. Thus, when the backside surface of integrated circuit device 200 is brought into contact with the contact surface 311 of member 310, the edges of device 200 do not make contact with the heat pipe.

Figure 4:
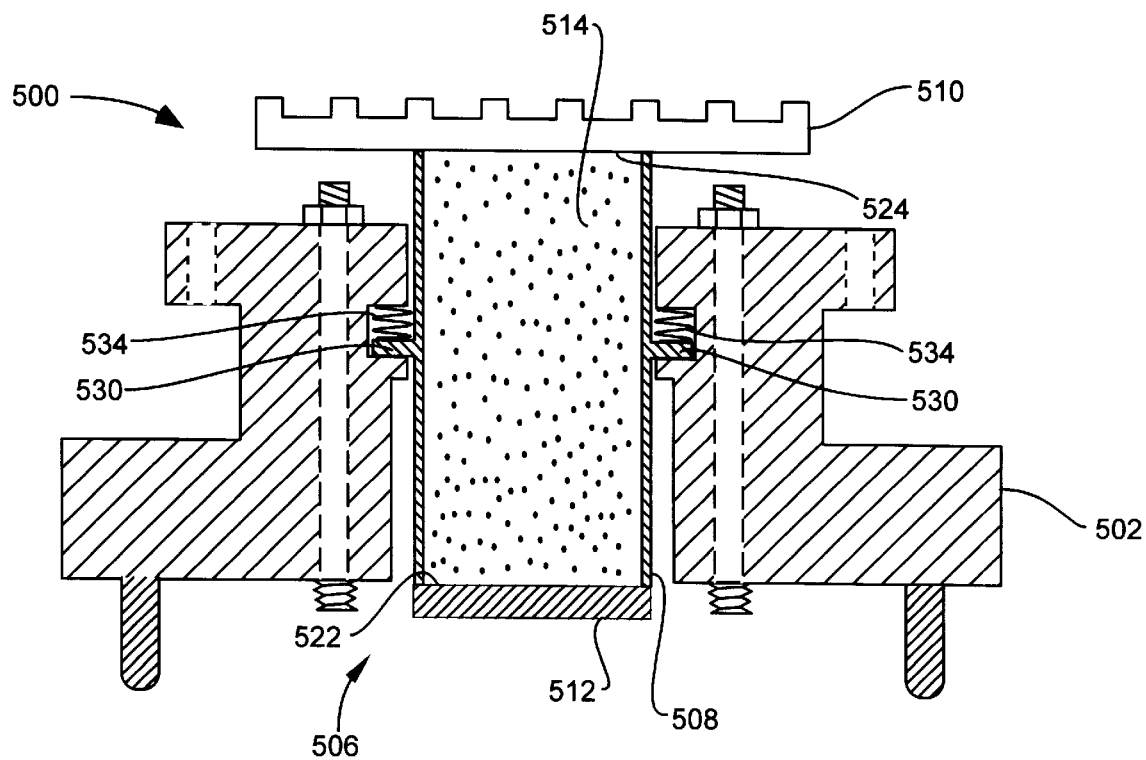
FIG. 4 is a pickup chuck having a rigid heat pipe.

FIG. 4 is a partial side view of a pickup chuck 500 in another embodiment of the invention. In lieu of utilizing a flexible heat pipe, as provided above, chuck 500 includes a rigid heat pipe 506 that is movably attached to the body 502 of pickup chuck 500. Heat pipe 506 includes a rigid housing 508 defining a cavity, a heat sink 510 at a first end of the housing, a heat slug 512 at a second end of the housing, and a wick structure 514.

Heat pipe housing 502 includes a flange portion 530 that is supported between the body 502 of chuck 500 and a set of springs 534. The manner in which the heat pipe is mounted to chuck 500 may permit the heat pipe to pivot, thus providing the heat pipe with a self-planarization feature.

In one embodiment, heat sink 510 extends out of the chuck body 502 into an air stream that is directed across the pickup chuck.

It is important to note that the implementation of the present invention is not limited to the specific vacuum chuck configuration disclosed herein. It is appreciated by those skilled in the art that the cooling apparatus of the present invention may be incorporated into a variety of chuck designs.

Thus, an improved apparatus and method for controlling the temperature of an integrated circuit or other heat generating device is described. Although many alterations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, and materials set forth within the specification are exemplary of the disclosed embodiments only. Other embodiments may utilize different dimensions, shapes, materials, and process steps, etc., to achieve substantially the same results. It is also important to note that the present invention is not limited to the testing of integrated circuits housed within PGA packages. The invention may be used to test die housed within BGA, LGA, TCP and other integrated circuit packages. Moreover, it is appreciated that the present invention may be used to cool other electronic or electrical devices.

What is claimed is:

1. A pickup chuck for holding a heat generating device having a first surface, said pickup chuck comprising:
   a body;
   a heat pipe attached to said body, said heat pipe having a first end defining an evaporator portion, a second end defining a condenser portion, and a working fluid;
   a thermally conductive member at said first end making contact with said surface of said heat generating device; and
   a vacuum port for retaining said heat generating device in contact with said thermally conductive member.

2. The pickup chuck of claim 2 wherein said heat pipe is flexible.

3. The pickup chuck of claim 1 wherein said heat pipe comprises a bellows defining a cavity; and a wick structure disposed in said cavity for facilitating the transport of said working fluid between said condenser portion and said evaporator portion.

4. The pickup chuck of claim 3 wherein said bellows and said wick structure are movably attached to said body such that said heat pipe may pivot and self-planarize.

5. The pickup chuck of claim 1 wherein said working fluid comprises water.

6. The pickup chuck of claim 1 further comprising a vacuum cup on said vacuum port.

7. The pickup chuck of claim 1 wherein said thermally conductive member comprises a metal foil.

8. The pickup chuck of claim 1 further comprising a finned heat sink at said second end.

9. A method for transferring heat from the surface of a heat generating device, said method comprising the steps of:

positioning a bellows heat pipe having a thermally conductive member disposed at a first end of said bellows heat pipe adjacent to said heat generating device; and compressing said bellows heat pipe against said heat generating device such that said thermally conductive member is in intimate contact with said heat generating device; and, retaining said heat generating device in contact with said heat pipe by a vacuum port.

10. The method of claim 9 wherein said bellows heat pipe is attached to a pickup chuck.

11. The method of claim 9 wherein said heat generating device comprises an integrated circuit device.

12. The method of claim 9 further comprising the step of producing an air flow across a finned heat sink disposed at a second end of said bellows heat pipe.

* * * * *

UNITED STATES PATENT AND TRADEMARK OFFICE
CERTIFICATE OF CORRECTION

PATENT NO.    : 5,944,093
DATED         : August 31, 1999
INVENTOR(S)   : Viswanath It is certified that error appears in the above-identified patent and that said Letters Patent is hereby corrected as shown below:

Column 3,
Line 18, delete "(212)" and insert -- (not shown) --.

Column 5,
Line 22, delete "306" and insert -- 302 --.

Signed and Sealed this

Seventeenth Day of June, 2003

JAMES E. ROGAN
*Director of the United States Patent and Trademark Office*